United States Patent [19]

Honda et al.

[11] Patent Number: 5,798,323
[45] Date of Patent: Aug. 25, 1998

[54] NON-CORROSIVE STRIPPING AND CLEANING COMPOSITION

[75] Inventors: Kenji Honda, Barrington, R.I.; Richard M. Molin, Phoenix; Gale L. Hansen, Chandler, both of Ariz.

[73] Assignee: Olin Microelectronic Chemicals, Inc., Cheshire, Conn.

[21] Appl. No.: 850,991

[22] Filed: May 5, 1997

[51] Int. Cl.$^6$ .................... C11D 7/26; C11D 7/32; C11D 7/50
[52] U.S. Cl. ............... 510/176; 510/175; 510/435; 510/505; 510/500; 510/255
[58] Field of Search ................. 510/175, 176, 510/435, 505, 500, 255

[56] References Cited

U.S. PATENT DOCUMENTS

| | | | |
|---|---|---|---|
| 4,395,348 | 7/1983 | Lee | 252/143 |
| 4,617,251 | 10/1986 | Sizensky | 430/256 |
| 4,732,695 | 3/1988 | Francisco | 252/162 |
| 4,770,713 | 9/1988 | Ward | 134/38 |
| 4,824,763 | 4/1989 | Lee | 430/258 |
| 4,904,571 | 2/1990 | Miyashita et al. | 430/331 |
| 5,174,816 | 12/1992 | Aoyama et al. | 106/203 |
| 5,279,771 | 1/1994 | Lee | 252/548 |
| 5,308,745 | 5/1994 | Schwartzkopf | 430/329 |
| 5,334,332 | 8/1994 | Lee | 252/548 |
| 5,417,877 | 5/1995 | Ward | 252/153 |
| 5,472,830 | 12/1995 | Honda | 430/331 |
| 5,496,491 | 3/1996 | Ward et al. | 252/153 |
| 5,507,978 | 4/1996 | Honda | 252/544 |
| 5,545,353 | 8/1996 | Honda | 510/176 |
| 5,563,119 | 10/1996 | Ward | 510/176 |
| 5,567,574 | 10/1996 | Hasemi et al. | 430/331 |
| 5,571,447 | 11/1996 | Ward et al. | 510/206 |
| 5,597,678 | 1/1997 | Honda et al. | 430/331 |
| 5,648,324 | 7/1997 | Honda et al. | 510/176 |
| 5,665,688 | 9/1997 | Honda et al. | 510/178 |
| 5,709,737 | 1/1998 | Malhotra et al. | 106/31.43 |

FOREIGN PATENT DOCUMENTS 0 647 884 A1  6/1994  European Pat. Off.
56-115368  9/1981  Japan.
63-208043  8/1988  Japan.
64-81949  3/1989  Japan.
64-88548  4/1989  Japan.
4-124668  4/1992  Japan.
4-350660  12/1992  Japan.
7-271057  10/1995  Japan.

*Primary Examiner*—Douglas J. McGinty
*Attorney, Agent, or Firm*—Ohlandt, Greeley, Ruggiero & Perle

[57] ABSTRACT

The present invention is directed to a non-corrosive photoresist stripping and cleaning composition, comprising:

(a) about 5% to about 50% solvent selected from the group consisting of N-methyl-2-pyrrolidinone, N-hydroxyethyl-2-pyrrolidinone, 1,3-dimethyl-2-imidazolidinone, dimethylsulfoxide, N,N-dimethylacetamide, diacetone alcohol, ethylene glycol, propylene glycol and admixtures thereof;

(b) about 10% to about 90% of an alkanolamine selected from the group consisting of diethyleneglycolamine, monoethanolamine, diethanolamine, triethanolamine, 2-(2-aminoethylamino)ethanol, and admixtures thereof;

(c) about 0.1% to about 4% of Formula I:

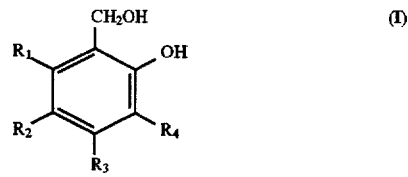

where $R_1$–$R_4$ are individually selected from the group consisting of hydrogen, alkyl groups having 1–4 carbon atoms, alkoxy groups having 1–4 carbon atoms, halogen groups, amino groups, hydroxyl groups, carboxyl groups or combinations thereof; and (d) about 0.1% to about 40% of water, all percentages by weight of the total stripping and cleaning composition.

7 Claims, No Drawings

NON-CORROSIVE STRIPPING AND CLEANING COMPOSITION

BACKGROUND OF THE INVENTION

1. Field of the Invention

The present invention relates to a non-corrosive photoresist stripping and cleaning composition containing a combination of certain percentages of (1) selected solvents; (2) selected alkanolamine compounds; (3) selected corrosion inhibitors; and (4) water.

2. Brief Description of the Art

The photoresist stripper/plasma etch residue cleaner arts are replete with numerous references to compositions containing either a polar solvent or an alkanolamine compound, or both. The presence of an alkanolamine in photoresist stripper compositions has been judged to be essential to effectively remove cross-linked resist films. However, alkanolamine-type photoresist strippers sometimes have a serious problem of corrosion, especially with aluminum substrates.

It is believed that the corrosion is caused in part by the ionization of water with the alkanolamine in post-stripping water rinse, as residual stripper solution may be retained on the substrate surface and/or substrate carrier after the stripping step. In other words, the alkanolamine component of the stripper composition does not corrode the substrate by itself, but can trigger water to cause the corrosion.

To solve this problem, an intermediate rinse step with an organic solvent (e.g., isopropyl alcohol) has been used between the stripping step and the post-stripping rinse with water. However, such intermediate rinses are not necessarily desirable because overall stripping operation becomes more complicated and, furthermore, an additional solvent waste is produced. Accordingly, if alkanolamine-containing strippers are to be further employed, there is a need to solve this corrosion problem without intermediate organic solvent wastes.

In addition, other mechanisms of metal corrosion are known. For example, metal halides such as aluminum chloride tend to be generated as a plasma-etch by-products. Metal halides may cause corrosion of substrates when contacted with water from a water rinse following the cleaning process. Another corrosion mechanism is observed especially with alloys such as Al—Cu—Si during cleaning or in a post-clean rinse process. This type of corrosion is usually observed locally and is referred to as pitting. Pitting is thought to be caused by the galvanic type of the electrochemical reaction between two metals which have different electronegativities.

The present invention provides a solution for all the above-described types of corrosion.

Furthermore, during anisotropic plasma etching processes for via contacts, metal patterns, and passivation openings, "sidewall residues" are frequently deposited on the resist sidewall. After the oxygen plasma ashing of photoresist films, these residues become metal oxides. Incomplete removal of these residues interfere with the pattern definition and/or complete filling of via holes.

Several different chemistries have been identified for removing the post-etch residues, particularly the metal oxide type. For example, alkaline aqueous developers such as those containing tetramethylammonium hydroxide (TMAH) are known to attack aluminum. Thus, an aluminum oxide residue can be etched away with TMAH. However, other types of the post-etch residues associated with multi-metal systems such as Al/Si/Cu cannot be so easily removed with TMAH. TMAH also is ineffective on residues from polysilicon plasma etch processes.

The metal oxide type sidewall residues can also be removed with: (1) a mixture of hydrofluoric acid and ethylene glycol ether or (2) a mixture of nitric acid, acetic acid, and hydrofluoric acid. These solutions require extreme process control to prevent excessive attack of critical metal and oxide layers. In some device structures, these solutions are not useful because of their nonselective attack mechanisms.

Recently, Wai M. Lee described at Interconnects, Contact Metallization and Multilevel Metallization Symposium (183rd Spring Meeting of The Electrochemical Society) in Honolulu, Hi., May 16–21, 1993, that a hydroxylamine-containing amine/water-based stripper composition can remove some kinds of the sidewall residues. Although hydroxylamine has a potential to enhance the stripability and/or the metal corrosion inhibitor, it is not stable upon heating. Therefore, the use of hydroxylamine is not recommended, especially when used in a highly alkaline medium.

Accordingly, hydroxylamine is not suitable for use in stripping of photoresist films or cleaning of the post-etch residues at higher temperatures.

Illustrative of references suggesting photoresist stripping or plasma-etch residue cleaning compositions containing a polar solvent and/or an alkanolamine compound are the following:

U.S. Pat. No. 4,617,251, which issued to Sizensky et al. on Oct. 14, 1986, teaches a positive photoresist stripping composition containing (A) selected amine compound (e.g., 2-(2-aminoethoxy)ethanol; 2-(2-aminoethylamino)ethanol; and mixtures thereof) and (B) selected polar solvents (e.g., N-methyl-2-pyrrolidinone, tetrahydrofurfuryl alcohol, isophorone, dimethyl sulfoxide, dimethyl adipate, dimethyl glutarate, sulfolane, gamma-butyrolactone, N,N-dimethylacetamide and mixtures thereof). The reference further teaches that water as well as dyes or colorants, wetting agents, surfactants and antifoamers may be added into this composition.

U.S. Pat. No. 4,770,713, which issued to Ward on Sep. 13, 1988, teaches a positive photoresist stripping composition containing (A) a selected amide (e.g., N,N-dimethylacetamide; N-methylacetamide; N,N-diethylacetamide; N,N-dipropylacetamide; N,N-dimethylpropionamide; N, N-diethylbutylamide and N-methyl-N-ethyl-propionamide) and (B) a selected amine compound (e.g., monoethanolamine, monopropanolamine, methyl-aminoethanol). The patent also teaches this stripper may optionally contain a water-miscible nonionic detergent (e.g., alkylene oxide condensates, amides and semi-polar nonionics).

U.S. Pat. No. 4,824,763, which issued to Lee on Apr. 25, 1989, teaches positive-working photoresist stripping composition containing (A) triamine (e.g., diethylene-triamine) and (B) a polar solvent (e.g., N-methyl-2-pyrrolidinone, dimethylformamide, butyrolactone, aliphatic hydrocarbons, aromatic hydrocarbons, chlorinated hydrocarbons).

U.S. Pat. No. 4,904,571, which issued to Miyashita et al. on Feb. 27, 1990, teaches printed circuit board photoresist stripper composition containing (A) a solvent (e.g., water, alcohols, ethers, ketones, chlorinated hydrocarbons and aromatic hydrocarbons); (B) an alkaline compound dissolved in said solvent (e.g., primary amines, secondary amines, tertiary amines, cyclic amines, polyamines, quaternary ammonium hydroxides, sulfonium hydroxides, alkali hydroxides, alkali carbonates, alkali phosphates and alkali pyrophosphates); and (C) a borohydride compound dissolved in said solvent (e.g., sodium borohydride, lithium borohydride, dimethyl amine borone, trimethyl amine borone, pyridine borone, tert-butyl amine borone, triethyl amine borone, and morpholine borone).

U.S. Pat. No. 5,279,791, which issued to Lee on Jan. 18, 1994, teaches a stripping composition for removing resists from substrates containing (A) hydroxylamine (e.g., $NH_2OH$); (B) at least one alkanolamine; and optionally (C) at least one polar solvent.

U.S. Pat. No. 5,417,877 issued to Ward discloses 8-hydroxyquinoline as a corrosion inhibitor in combination with amide and amine mixtures.

U.S. Pat. No. 5,563,119 to Ward discloses an aqueous stripping composition that is essentially free of any hydroxylamine compounds. The composition is an aqueous mixture of an alkanolamine, tetraalkylammonium hydroxide, and an inhibitor. Useful inhibitors are disclosed to be catechol, pyrogallol, anthranilic acid, gallic acid, gallic esters, and the like.

U.S. Pat. No. 5,567,574 assigned to Mitsubishi Gas Chemical discloses use of sugar or sugar alcohols as a corrosion inhibitor in an aqueous stripping solution containing quaternary ammonium hydroxide or alkanolamine, respectively.

U.S. Pat. No. 5,571,447 to Ward discloses a stripping and cleaning composition containing a 60–85% by weight of a polyhydric alcohol, about 0.5–10% by weight of fluroboric acid, about 5–40% by weight of a polar solvent, and the remainder being a fluorine containing compound. Useful inhibitors are disclosed to be catechol, pyrogallol, anthranilic acid, gallic acid, gallic esters, and the like.

European Pat. Application No. 647884 assigned to J. T. Baker Inc. discloses nonaqueous photoresist stripper composition comprising (i) a stripping solvent (e.g. N-methyl-2-pyrrolidinone), (ii) a nucleophilic amine (e.g., monoethanolamine), and (iii) a reducing agent such as salicyl aldoxime, gallic acid, and gallic acid esters.

German Published Pat. Application No. DE3828513, which issued to Schulz on Mar. 1, 1990, teaches a positive and negative photoresist stripper composition containing (A) an aprotic polar solvent (e.g., 1,3-dimethyl-2-imidazolidinone or 1,3-dimethyl-tetrahydropyrimidinone); and (B) an organic base (e.g., alkanolamine).

Japanese Published Pat. Application No. 56-115368, which was published on Sep. 10, 1981 and is assigned to San Ei Chemical Industries, KK, teaches a photoresist stripping composition containing (A) nonionic surface activator (e.g., a polyethylene glycol ether); (B) organic solvent (e.g., cyclohexanone); and (C) either a swelling agent (e.g., polyethylene glycol) or penetrant (e.g., 2-aminoethanol).

Japanese Published Pat. Application No. 63-208043, which issued to R. Ohtani (Kanto Chemical) on Aug. 29, 1988, teaches a positive-working photoresist stripper composition containing (A) 1,3-dimethyl-2-imidazolidinone; (B) a water-soluble organic amine (e.g., monoethanolamine, 2-(2-aminoethoxy)ethanol, triethylenetetramine. The application also teaches a surfactant may be added to the stripper.

Japanese Published Pat. Application No. 64-088548, which issued to S. Shiotsu (Nagase Denshi Kagaku) on Apr. 3, 1989, teaches the use of 2-butyne-1,4-diol as a corrosion inhibitor for a positive photoresist stripper.

Japanese Published Pat. Application No. 1-081949, which issued to K. Matsumoto (Asahi Chemical) on Mar. 28, 1989, teaches a positive-working photoresist stripper composition containing (A) gamma-butyrolactone, N-methylformamide, N,N-dimethylformamide, N,N-dimethylacetoamide or N-methyl-2-pyrrolidinone; (B) an amino alcohol (e.g., N-butyl-ethanolamine and N-ethyldiethanolamine); and (C) water.

Japanese Published Pat. Application No. 4-124668, which issued to K. Wakiya (Tokyo Ohka Kogyo) on Apr. 24, 1992, teaches the use of a phosphoric acid group containing surfactant as a corrosion inhibitor in a photoresist stripper.

Japanese Published Pat. Application No. 4-350660, which issued to H. Goto (Texas Instruments, Japan and Kanto Chemical, Inc.) on Dec. 4, 1992, teaches a stripper for positive photoresists comprising (A) 1,3-dimethyl-2-imidazolidinone, (B) dimethylsulfoxide and (C) a water-soluble amine (e.g., monoethanolamine or 2-(2-aminoethoxy)ethanol wherein the amount of the water-soluble amine is 7–30% by weight.

Japanese Published Pat. Application No. 7-271057, which was published on Oct. 20, 1995, and is assigned to Tokyo Ohka Kogyo, teaches positive photoresist compositions that contain N,N-diethylamine. Preferred formulations also contained either alkanolamines (e.g., monoethanolamine); water-miscible organic solvents (e.g. N-methyl-2-pyrrolidinone); water; additives (e.g., hydroxy aromatic compounds or triazole compounds); or carboxylic group-containing organic compounds, or certain combinations thereof. Salicyl alcohol is one of the preferred hydroxy aromatic compounds.

Only Japanese Published Pat. Application No. 7-271057 of the above-noted references suggests the addition of salicyl alcohol to an admixture of a water-miscible polar solvent and an alkanolamine for the application to photoresist stripping composition or plasma-etch residue cleaning composition. However, that reference requires the presence of a hydroxylamine compound, N,N-diethylhydroxylamine (DEHA), to achieve its desired performance.

SUMMARY OF THE INVENTION

In one aspect, the present invention is directed to a non-corrosive stripping and cleaning composition, comprising:

(a) about 5% to about 50% of a solvent selected from the group consisting of N-methyl-2-pyrrolidinone, N-hydroxyethyl-2-pyrrolidinone, 1,3-dimethyl-2-imidazolidinone, dimethylsulfoxide, N,N-dimethylacetamide, diacetone alcohol, ethylene glycol, propylene glycol and admixtures thereof;

(b) about 10% to about 90% of an alkanolamine selected from the group consisting of diethyleneglycolamine, monoethanolamine, diethanolamine, triethanolamine, 2-(2-aminoethylamino)ethanol, and admixtures thereof;

(c) about 0.1% to about 4% of a corrosion inhibitor having formula (I):

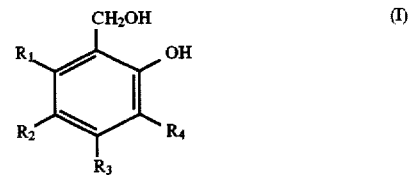

where $R_1$–$R_4$ are individually selected from the group consisting of hydrogen, alkyl group having 1–4 carbon atoms, alkoxy group having 1–4 carbon atoms groups, halogen group, amino group, hydroxyl group, and carboxyl group; and (d) about 1% to about 40% of water, all percentages by weight of the total weight of the stripping and cleaning composition.

DESCRIPTION OF THE PREFERRED EMBODIMENTS

As defined herein, the term "non-corrosive" refers to suppression of any chemical action that gradually wears away a substrate. The term "stripping and cleaning composition" refers to a composition that is able to both (1) remove or strip a photoresist (or other similar organic polymeric material) film or layer from a semiconductor substrate and (2) remove or clean various types of plasma-etch residues (also sometimes called plasma side wall polymers) from a semiconductor substrate.

As stated above, the non-corrosive stripping and cleaning composition of the present invention has four components, namely one or more selected polar solvents, one or more selected alkanolamine compounds, one or more selected corrosion inhibitors; and water. These four components must be present in certain percentages. Also, the present invention is preferably free of hydroxylamine compounds such as hydroxylamine or N,N-diethylhydroxylamine.

Solvents used in the stripping and cleaning composition of the invention include N-methyl-2-pyrrolidinone (NMP), N-hydroxyethyl-2-pyrrolidinone (HEP), 1,3-dimethyl-2-imidazolidinone (DMI), dimethylsulfoxide (DMSO), N,N-dimethylacetamide (DMAC), diacetone alcohol, (DAAL), ethylene glycol (EG), propylene glycol (PG) or combinations thereof. NMP is one preferred solvent. These solvents are especially effective in terms of photoresist stripping power and are preferred in the present invention.

Another preferred solvent mixture is an admixture of HEP with one or more of other solvents wherein the mixing ratio of HEP to the other solvent(s) is from about 10:90% to about 90:10% by weight as HEP is a known safer and viscous solvent while the other solvents are powerful stripping solvents with low viscosity. In general, stripping power is increased by lowering the viscosity of a stripper solution.

Alkanolamines are also included in the stripping and cleaning composition, as mentioned above. Preferred alkanolamines include diethyleneglycolamine (DEGA), monoethanolamine (MEA), diethanolamine (DEA), triethanolamine (TEA), 2-(2-aminoethylamino)ethanol and admixtures thereof. MEA is especially preferred.

Corrosion inhibitors useful in the present invention include salicyl alcohol and its substituted derivatives as included in the above Formula (I). This family of compounds has been found to effectively inhibit the corrosion without any reduction of the stripping power. These compounds provide a superior balance of various functional and economic requirements, including excellent prevention of metal contamination of substrate surfaces, and favorable material cost for the desired corrosion inhibition effect. In one preferred embodiment, $R_1-R_4$ are all hydrogen to give the structure of salicyl alcohol (CAS No. 90--01-7; also known as 2-hydroxybenzyl alcohol), which is represented by Formula (II).

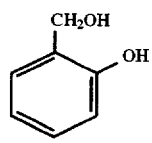

(II)

In another preferred embodiment, $R_1$ and $R_3$ are hydrogen and $R_2$ and $R_4$ are methyl to give the structure of 2,4-dimethyl-6-hydroxymethylphenol, which is represented by Formula (III):

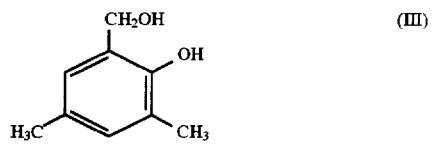

(III)

The fourth critical ingredient is water. It has been shown that the presence of water increases the cleaning power when the composition of the invention is used as a cleaner of post-plasma etch residue.

Optional ingredients in the stripping and cleaning composition of the invention include water-soluble surface-active agents. Exemplary surface-active agents include poly(ethylene oxide) condensates with fatty alcohols manufactured by Olin Corporation of Norwalk, Conn. under the trade name of "POLY-TERGENT® CS-1".

The preferred amounts of these ingredients are about 8–40% polar solvent; about 20–80% amine compound; about 0.2–3.8% corrosion inhibitor; 5–35% water; and, if used, 0.01–2% surface-active compound; all based on the weight of the stripping and cleaning composition. The more preferred amounts of these ingredients are about 10–35% polar solvent; about 30–70% amine compound; about 0.5–3.5% corrosion inhibitor; about 10–30% water; and, if used, about 0.05–1% surface-active compound; all based on the weight of the total composition.

Various other ingredients known to those skill in the art may optionally be included in the stripping and cleaning composition e.g., dyes or colorants, wetting agents, antifoamers and so forth. Generally, the amount of each of these other optional ingredients would be about 0.01–0.5% by weight, based on the total composition.

The stripping and cleaning composition of the invention is prepared by dissolving one or more selected corrosion inhibitors with one or more selected solvents and one or more selected alkanol compounds at room temperature. As indicated above, optional ingredients may also be added.

One function of the described stripping and cleaning composition is removal or stripping organic polymeric material from a substrate. This aspect of the invention is carried out by contacting an organic polymeric material such as a photoresist film with the described stripping and cleaning composition. The above-described composition may also be used in removing post-plasma etch by-products after plasma etching of a metalized wafer. These plasma-etch byproducts are, for example, oxides or halides of aluminum, titanium, copper or related metals such as $AlCl_3$, $AlF_3$, $Al_2O_3$, $SiF4$, $SiO2$ and the like. This aspect of the invention is carried out by contacting the plasma-etch residues with the described cleaner solution. The actual conditions, i.e., temperature, time, and the like, may vary over wide ranges and are generally dependent on the nature and thickness of the organic polymeric material or plasma-etch residue to be removed, as well as other factors familiar to those skilled in the art. In general, however, temperatures ranging from about 25° C. to about 100° C. for a period of about 10 minutes to about 60 minutes are typical.

A variety of means can be employed in contacting the organic polymeric material and/or plasma-etch residues with the stripping and cleaning composition in the practice of the invention. For example, the substrate containing the organic polymeric material and/or plasma-etch residue can be immersed in a stripping and cleaning bath or the stripping and cleaning composition can be sprayed over the surface of the organic polymeric material, as well as plasma-etch residues, as will be apparent to those skilled in the art.

The stripping and cleaning composition of the invention is effective in removing a wide variety of organic polymeric materials and plasma-etch residues from substrates. Exemplary organic polymeric materials include positive- and negative-working g/i-line and deep UV resists, electron beam resists, X-ray resists, ion beam resists, as well as organic dielectric materials such as polyimide resins, and so forth. Specific examples of organic polymeric materials which can be removed in the practice of the invention include positive resists containing phenol-formaldehyde resins or poly(p-vinylphenol), negative resists containing cyclized polyisoprene, or poly(p-vinylphenol); and polymethylmethacrylate-containing resists. In particular, the stripping and cleaning composition has been found to be highly effective in removing positive resists containing a novolak resin and a diazonathoquinone type sensitizer, e.g., ortho naphthoquinone diazide sulfonic acid ester. Resists of this type include HPR 204 Series POSITIVE RESIST, HPR 504 Series POSITIVE RESIST, OiR32 Series POSITIVE RESIST, and HPR 6500 Series POSITIVE RESIST, all available commercially from Olin Microelectronic Materials, of Norwalk, Conn. The organic polymeric material residues can be removed from any of the conventional substrates known to those skilled in the art, such as silicon, silicon dioxide, silicon nitride, polysilicon, aluminum, aluminum alloys, copper, copper alloys, polyimides, and so forth.

The present invention is further described in detail by means of the following Examples and Comparisons. All parts and percentages are by weight and all temperatures are degrees Celsius unless explicitly stated otherwise.

EXAMPLE 1

A stripping/cleaning solution was prepared by mixing 30.0 g of N-methyl-2-pyrrolidinone (NMP), 57.0 g of monoethanolamine (MEA), 10.0 g of water, and 3.0 g of salicyl alcohol (Salal), and stirring to produce a pale yellow clear solution. The ratio by weight of the components in the resulting solution was NMP/MEA/$H_2O$/Salal=30/57/10/3.

Silicon wafers which have a multi-layer of Al—Si—Cu/ $SiO_2$/Si were prepared by plasma deposition method and furthermore top-coated with photoresist (PR) at a film thickness of 1.0 micron by spin coating method. Micropatterning was applied to the PR layer photolithographically, followed by pattern transfer onto the metal layer by plasma etching with the pre-patternized PR mask. Thus obtained wafers contained both residues of PR and plasma etching by-products which were a mixture of silicon and aluminum oxides and halides. The composition of the resulting plasma-etch residue (PER) is not simple and not known exactly.

The wafers obtained were cut into 1 cm×1 cm pieces and placed in a 200 ml beaker which contained 100 ml of the above-mentioned stripping/cleaning solution in a temperature-control bath at 75° C. The pieces were immersed in the stripping/cleaning solution and the solution was stirred gently at 75° C. for 25 minutes. The pieces were transferred to another beaker which contained deionized water at room temperature and gently stirred for 5 minutes. The pieces were removed from the deionized water and dried by blowing nitrogen gas onto the surfaces.

The wafer pieces were inspected under a scanning electron microscope (SEM) after gold sputtering. Topdown and cross-section views of the wafer SEM pictures were obtained to visualize the residues of PR and PER on the wafers. In addition, the exposed metal layer surface was inspected under SEM to evaluate any corrosion of the metal surface.

The SEM inspection result indicated that the present formulation of NMP/MEA/$H_2O$/Salal=30/57/10/3 removed both residues of PR and PER without metal corrosion even if the post-strip intermediate rinse with an organic solvent such as isopropyl alcohol (IPA rinse) was not applied.

EXAMPLES 2–10

Examples 2–10 illustrate additional combinations of solvent, alkanolamine, water, and salicyl alcohol under different strip conditions. Detailed formulations and test conditions are summarized in Table 1 with the SEM inspection of each result.

CONTROL FORMULATION

In addition to the above-described Examples 1–10, a control formulation that contained no corrosion inhibitor was prepared as follows: NMP/MEA/$H_2O$=33/57/10. The strip test condition was the same as described in Example 1.

The SEM inspection result showed that both residues of PR and PER were completely removed as shown in Example 1. However, the metal layer was severely corroded in comparison to the formulation of Example 1.

COMPARISON FORMULATIONS

The effectiveness of stripping/cleaning formulations containing other corrosion inhibitors (salicylaldoxime ("Saladox"), gallic acid ("Gallad"), and propyl gallate ("Progal") was examined in a combination with a NMP/ MEA/$H_2O$ admixture under the same condition as described in Example 1.

In Table 1, CIN is corrosion inhibitor; PR is photoresist stripping; PER is plasma-etch residue cleaning; +++ is highest score; +/− is no effect; − is negative result.

The following conclusions may be drawn based on the results shown in Table 1.

(1) The presence of salicyl alcohol in the mixture of solvent, alkanolamine, and water is essential to prevent metal corrosion during the photoresist stripping and plasma-etch residue cleaning.

(2) There is a concentration dependency of salicyl alcohol on the corrosion inhibition.

(3) The corrosion inhibition with salicyl alcohol is also affected by the stripping process parameters such as temperature and time. There is thus an optimum condition existing for the strip temperature and time.

(4) The post-strip intermediate rinse with an organic solven like isopropyl alcohol is not necessary with the best composition of this chemistry concerning the corrosion inhibition.

(5) Salicyl alcohol is the best corrosion inhibitor among the several compounds tested. Other inhibitors show a tradeoff between the corrosion inhibition vs. the stripping/ cleaning power. Salicyl alcohol has no such tradeoff, probably due to its unique chemical structure and chelating property, especially for the substrate metal and/or plasma etching by-products.

TABLE 1

| Example | Formulation | | | | Conditions | | | Performance | | |
|---|---|---|---|---|---|---|---|---|---|---|
| | NMP (wt %) | MEA (wt %) | H₂O (wt %) | CIN (wt %) | IPA RINSE | TEMP (°C.) | TIME (min) | PR | PER | CORROSION INHIBITION |
| 1 | 30 | 57 | 10 | Salal (3%) | no | 75 | 25 | +++ | +++ | +++ |
| 2 | 30 | 57 | 10 | Salal (3%) | yes | 75 | 25 | +++ | +++ | +++ |
| 3 | 31 | 57 | 10 | Salal (2%) | no | 75 | 25 | +++ | +++ | ++ |
| 4 | 32 | 57 | 10 | Salal (1%) | no | 75 | 25 | +++ | +++ | +/− |
| 5 | 30 | 57 | 10 | Salal (3%) | no | 70 | 25 | ++ | ++ | +++ |
| 6 | 30 | 57 | 10 | Salal (3%) | no | 80 | 25 | +++ | +++ | + |
| 7 | 30 | 57 | 10 | Salal (3%) | no | 75 | 15 | ++ | ++ | +++ |
| 8 | 30 | 57 | 10 | Salal (3%) | no | 75 | 5 | + | ++ | +++ |
| 9 | 20 | 57 | 20 | Salal (3%) | no | 75 | 25 | ++ | +++ | +/− |
| 10 | 10 | 57 | 30 | Salal (3%) | no | 75 | 25 | + | +++ | − |
| Control | 33 | 57 | 10 | 0 | no | 75 | 25 | +++ | +++ | − |
| Comp. 1 | 30 | 57 | 10 | Saladox (3%) | no | 75 | 25 | ++ | + | +/− |
| Comp. 2 | 30 | 57 | 10 | Gallad (3%) | no | 75 | 25 | ++ | + | +/− |
| Comp. 3 | 30 | 57 | 10 | Progal (3%) | no | 75 | 25 | ++ | + | +/− |

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A non-corrosive stripping and cleaning composition which is free of hydroxylamine compound, comprising:

(a) about 5% to about 50% of solvent selected from the group consisting of N-methyl-2-pyrrolidinone, N-hydroxyethyl-2-pyrrolidinone, 1,3-dimethyl-2-imidazolidinone, dimethylsulfoxide, N,N-dimethylacetamide, diacetone alcohol, ethylene glycol, propylene glycol and admixtures thereof;

(b) about 10% to about 90% alkanolamine selected from the group consisting of diethyleneglycolamine, monoethanolamine, diethanolamine, triethanolamine, 2-(2-aminoethylamino)ethanol and admixtures thereof;

(c) about 0.1 to about 4% of a corrosion inhibitor of Formula (I)

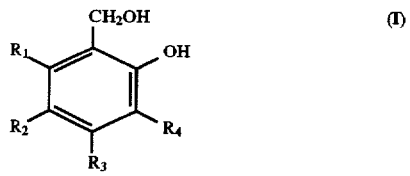

(I)

where $R_1$–$R_4$ are individually selected from the group consisting of hydrogen, alkyl group having 1–4 carbon atoms, alkoxy group having 1–4 carbon atom, halogen group, amino group, hydroxyl group, carboxylic group; and (d) about 0.1% to about 40% water;

all percentages by weight, based on the total weight of the stripping and cleaning composition.

2. The non-corrosive stripping and cleaning composition of claim 1, wherein said corrosion inhibitor is salicyl alcohol.

3. The non-corrosive stripping and cleaning composition of claim 1, wherein said solvent comprises about 8–40%, said alkanolamine comprises about 20–80%, said corrosion inhibitor comprises about 0.2–3.8%, and said water comprises about 5–35%, all percentages by weight based on the total weight of the stripping and cleaning composition.

4. The non-corrosive stripping and cleaning composition of claim 1, wherein said solvent comprises about 10–35%, said alkanolamine comprises about 30–70%, said corrosion inhibitor comprises about 0.5–3.5%, and said water comprises about 10–30%, all percentages by weight based on the total weight of the stripping and cleaning composition.

5. The non-corrosive stripping and cleaning composition of claim 1, further comprising about 0.01% to about 2% by weight of a surface-active compound, said percentages based on the total weight of the composition.

6. The non-corrosive stripping and cleaning composition of claim 1, wherein said corrosion inhibitor is 2,4-dimethyl-6-hydroxymethylphenol.

7. A non-corrosive stripping and cleaning composition which is free of hydroxylamine compound comprising:

(a) about 8–40% N-methyl-2-pyrrolidinone;
   (b) abut 20–80% monoethanolamine;
   (c) about 0.2–3.8% salicyl alcohol; and
   (d) about 5–35% water;

all percentages by weight based on the total weight of the stripping and cleaning composition.

* * * * *